United States Patent
Matsuda

(10) Patent No.: US 10,104,774 B2
(45) Date of Patent: Oct. 16, 2018

(54) FLEXIBLE PRINTED WIRING BOARD

(71) Applicant: NIPPON MEKTRON, LTD., Tokyo (JP)

(72) Inventor: Fumihiko Matsuda, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/558,371

(22) PCT Filed: Nov. 20, 2015

(86) PCT No.: PCT/JP2015/082656
§ 371 (c)(1),
(2) Date: Sep. 14, 2017

(87) PCT Pub. No.: WO2016/147487
PCT Pub. Date: Sep. 22, 2016

(65) Prior Publication Data
US 2018/0084644 A1    Mar. 22, 2018

(30) Foreign Application Priority Data

Mar. 16, 2015  (JP) .................................. 2015-052697

(51) Int. Cl.
*H05K 1/00* (2006.01)
*H05K 1/14* (2006.01)
(Continued)

(52) U.S. Cl.
CPC ............. *H05K 1/147* (2013.01); *H05K 1/028* (2013.01); *H05K 1/0393* (2013.01);
(Continued)

(58) Field of Classification Search
CPC ............................... H05K 1/147; H05K 1/028
(Continued)

(56) References Cited

U.S. PATENT DOCUMENTS 3,818,122 A * 6/1974 Luetzow .................. H01B 7/04
                                                              174/117 FF
2011/0114370 A1* 5/2011 Wang ....................... H05K 1/02
                                                              174/254
(Continued)

FOREIGN PATENT DOCUMENTS

JP      S63-019708       2/1988
JP      S63194412 U     12/1988
(Continued)

OTHER PUBLICATIONS

"Self-supportsliding FPC", Oki Electric Cable Co. Ltd., JPCA Show 2017, Jun. 4, 2014, http://www.okidensen.co.jp/jp/event/2014/jpca2014.html, http://www.okidensen.co.jp/jp/prod/fpc/flexible/jiritu/jiritu_fpc.html.

*Primary Examiner* — Sherman Ng
(74) *Attorney, Agent, or Firm* — Harness, Dickey & Pierce, P.L.C.

(57) ABSTRACT

Provided is a flexible printed wiring board capable of increasing the number of wires even when the board is used in a narrow arrangement space and enhancing the degree of freedom for design while maintaining the board in a self-supported state. A flexible printed wiring board 100 is used in a state, in which one and another ends in a longitudinal direction are fixed respectively to one and another members that move in relation to each other in a state of being bent to be curved in the longitudinal direction. The flexible printed wiring board includes wiring board units 100A and 100B in which a plurality of wires are formed on a flexible insulating substrate and which are molded in a state of being curved in a lateral direction, and adjacent wiring board units are partially connected at side edges thereof in the lateral direction.

6 Claims, 17 Drawing Sheets

(51) Int. Cl.
   *H05K 1/02* (2006.01)
   *H05K 1/03* (2006.01)
(52) U.S. Cl.
   CPC ........... *H05K 2201/0129* (2013.01); *H05K 2201/0141* (2013.01); *H05K 2201/055* (2013.01)
(58) Field of Classification Search
   USPC .......................................... 174/254; 361/749
   See application file for complete search history.

(56) References Cited

U.S. PATENT DOCUMENTS

2011/0132643 A1* 6/2011 Hattori et al. ............ C22F 1/08
                                                    174/254
2014/0073152 A1* 3/2014 Lenahan .............. H05K 1/0215
                                                    439/86

FOREIGN PATENT DOCUMENTS

| JP | H06338185 A | 12/1994 |
| JP | 2008243839 A | 10/2008 |
| JP | 2011194520 A | 10/2011 |
| JP | 2013074166 A | 4/2013 |

* cited by examiner

FLEXIBLE PRINTED WIRING BOARD

CROSS-REFERENCE TO RELATED APPLICATIONS

This application is a National Stage of International Application No. PCT/JP2015/082656, filed Nov. 20, 2015 (now WO 2016/147487A1), which claims priority to Japanese Application No. 2015-052697, filed Mar. 16, 2015. The entire disclosures of each of the above applications are incorporated herein by reference.

FIELD

The present disclosure relates to a flexible printed wiring board which uses a flexible insulating substrate.

BACKGROUND

Conventionally, various wires are used for establish electrical connection between components provided in industrial apparatuses, robots, game machines, and the like as well as various electronic apparatuses such as communication and video apparatuses. Particularly, a cable bear (registered trademark), for example, is used in portions where smooth movement of components in apparatuses is required (see PTL 1). However, according to this technique, since members for supporting cables and the like are required, the cable bears require relatively large space for arrangement. In contrast, the use of a flexible printed wiring board enables the arrangement space to be narrowed. However, when an ordinary flexible printed wiring board is used as it is, the flexible printed wiring board sags. Therefore, it is impossible to employ an ordinary flexible printed wiring board without modification, depending on the position where the board is used. In contrast, a technique in which a flexible printed wiring board is molded in a state of being curved in a lateral direction so that the board does not sag is known (see PTL 2 and 3). This technique will be described with reference to FIGS. 22 and 23. FIG. 22 is a perspective view of an ordinary flexible printed wiring board. FIG. 23 is a perspective view of a flexible printed wiring board according to a related art.

In an ordinary flexible printed wiring board 500, when one and another ends in a longitudinal direction of the board are fixed respectively to one and another members (not illustrated) that move in relation to each other, the flexible printed wiring board 500 sags (see FIG. 22). Due to this, when the sagging flexible printed wiring board 500 makes contact with various components and inconvenience occurs, it is impossible to use the board. In contrast, in a flexible printed wiring board 600 molded in a state of being curved in a lateral direction, even when one and another ends in a longitudinal direction are fixed respectively to one and anther members that move in relation to each other, the board is self-supported and does not sag (see FIG. 23). In FIG. 23, R1 indicates the radius of curvature of a curved portion that is bent to be curved in the longitudinal direction in order to fix one and the other ends in the longitudinal direction of the flexible printed wiring board 600 to respectively to the one and the other members that move in relation to each other. R2 indicates the radius of curvature of a curved portion that is curved in the lateral direction of the flexible printed wiring board 600.

Here, it is experimentally proven that the radii of curvature R1 and R2 are correlated and these values are approximately equal to each other. Therefore, when the number of wires in the flexible printed wiring board 600 is increased, since the width (the width in the lateral direction) increases, the radius of curvature R2 increases and the radius of curvature R1 also increases. As a result, the distance in the height direction (up-down direction) in FIG. 23 also increases.

Due to this, depending on the space in which the flexible printed wiring board 600 is disposed, since the width of the flexible printed wiring board 600 is limited and the number of wires is also limited, the degree of freedom for design decreases.

CITATION LIST

Patent Literature

[PTL 1] Japanese Patent Application Publication No. 2008-243839
[PTL 2] Japanese Utility Model Application Publication No. S63-194412
[PTL 3] Japanese Patent Application Publication No. 2013-74166

Non Patent Literature

[NPL 1] Exhibits on JPCA Show 2014, Oki Electric Cable Co., Ltd.

SUMMARY

Technical Problem

An object of the present disclosure is to provide a flexible printed wiring board capable of increasing the number of wires even when the board is used in a narrow arrangement space and to increase the degree of freedom for design while maintaining the board in a self-supported state.

Solution to Problem

The present disclosure employs the following means in order to solve the problem.

That is, a flexible printed wiring board according to the present disclosure is a flexible printed wiring board used in a state, in which one and another ends in a longitudinal direction are fixed respectively to one and another members that move in relation to each other, in a state of being bent to be curved in the longitudinal direction, the flexible printed wiring board comprising: a plurality of wiring board units in which a plurality of wires are formed on a flexible insulating substrate and which are molded in a state of being curved in a lateral direction, wherein adjacent wiring board units are partially connected at side edges thereof in the lateral direction.

According to the present disclosure, since the wiring board units molded in a state of being curved in the lateral direction are connected to each other, it is possible to decrease the radius of curvature of the curved portion that is bent to be curved in the longitudinal direction. That is, the radius of curvature of the curved portion that is bent to be curved in the longitudinal direction can be set to be approximately equal to the radius of curvature of the curved portion that is curved in the lateral direction of the wiring board unit. Therefore, the flexible printed wiring board can be applied to a narrow arrangement space. Since the respective wiring board units are molded in a state of being curved in the lateral direction, the wiring board units do not sag and can be self-supported in a state in which one and another ends of the flexible printed wiring board are supported. Moreover, since the plurality of wiring board units are connected to each other, it is possible to increase the number of wires. Therefore, even when the flexible printed wiring board is used in a narrow arrangement space, it is possible to increase the number of wires and to increase the degree of freedom for design. The expression "two members that move in relation to each other" includes a case in which only one member moves, a case in which the other member only moves, and a case in which both members move.

Moreover, the adjacent wiring board units may be connected in a region excluding a region in which a position, at which the wiring board unit is curved in the longitudinal direction moves when the two members, move in relation to each other.

In this way, since adjacent wiring board units are not connected in a region in which the position at which the wiring board unit is curved in the longitudinal direction moves when the two members move in relation to each other, it is possible to suppress the adjacent wiring board units from having an adverse effect. Due to this, it is possible to suppress the adjacent wiring board units from applying a load to each other and to suppress damage to the respective wiring board units.

The curved portions in the lateral direction of the adjacent wiring board units may protrude in different directions and connected portions of the adjacent wiring board units may be bent, so that the plurality of wiring board units overlap each other.

In this way, it is possible to narrow the width (the width in the lateral direction) of the entire flexible printed wiring board.

The insulating substrate may be formed of a thermoplastic resin and the respective wiring board units may be molded to be curved in the lateral direction by a heating process. Moreover, the thermoplastic resin may be a liquid crystal polymer.

The above-described respective configurations can be combined with one another wherever possible.

Advantageous Effects of the Disclosure

As described above, according to the present disclosure, it is possible to increase the number of wires even when the board is used in a narrow arrangement space and to increase the degree of freedom for design while maintaining the board in a self-supported state.

DRAWINGS

DETAILED DESCRIPTION

Hereinafter, modes for carrying out the present disclosure will be exemplarily described in detail based on embodiments with reference to the drawings. However, the dimensions, materials, shapes, relative arrangements and the like of components described in the embodiments are not intended to limit the scope of the present disclosure unless specifically described particularly.

Embodiment 1

A flexible printed wiring board according to Embodiment 1 of the present disclosure will be described with reference to FIGS. 1 to 10.

<Configuration of Flexible Printed Wiring Board>

Figure 1:
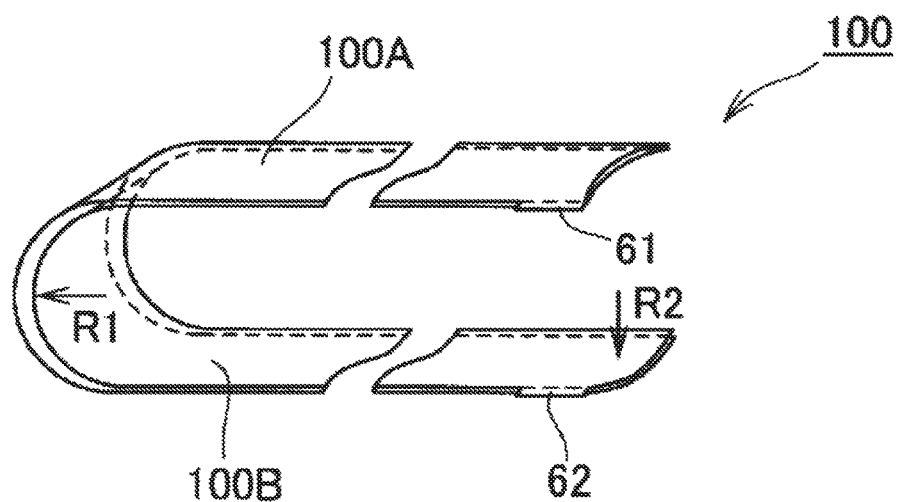
FIG. 1 is a perspective view of a flexible printed wiring board according to Embodiment 1 of the present disclosure.

A configuration of the flexible printed wiring board according to the present embodiment will be described particularly with reference to FIG. 1. FIG. 1 is a perspective view of the flexible printed wiring board according to Embodiment 1 of the present disclosure.

A flexible printed wiring board 100 according to the present embodiment is a printed wiring board in which a plurality of wires are formed on a flexible insulating substrate. Moreover, the flexible printed wiring board 100 according to the present embodiment is used in a state of being bent to be curved in a longitudinal direction. R1 indicates the radius of curvature of a curved portion of the flexible printed wiring board 100 that is bent to be curved in the longitudinal direction. Moreover, the flexible printed wiring board 100 according to the present embodiment has a configuration in which a plurality of wires are formed on a flexible insulating substrate and the board includes two wiring board units molded in a state of being curved in a lateral direction. Hereinafter, these two wiring board units will be referred to as a first wiring board unit 100A and a second wiring board unit 100B for the sake of convenience. Moreover, R2 indicates the radius of curvature of a curved portion that is curved in the lateral direction of the first and second wiring board units 100A and 100B. The radius of curvature R2 in the first wiring board unit 100A and the radius of curvature R2 in the second wiring board unit 100B are designed to be equal to each other. Therefore, the radii of curvature of the curved portions that are curved in the lateral direction of the wiring board units are approximately the same.

The first and second wiring board units 100A and 100B which are adjacent to each other are partially connected at side edges in the lateral direction. More specifically, these first and second wiring board units 100A and 100B are connected at side edges in the lateral direction near both ends in the longitudinal direction. Hereinafter, these two connection portions will be referred to as a first connection portion 61 and a second connection portion 62 for the sake of convenience. In the flexible printed wiring board 100 according to the present embodiment, these first and second connection portions 61 and 62 are bent whereby the first and second wiring board units 100A and 100B overlap each other.

<Use Example of Flexible Printed Wiring Board>

Figure 2:
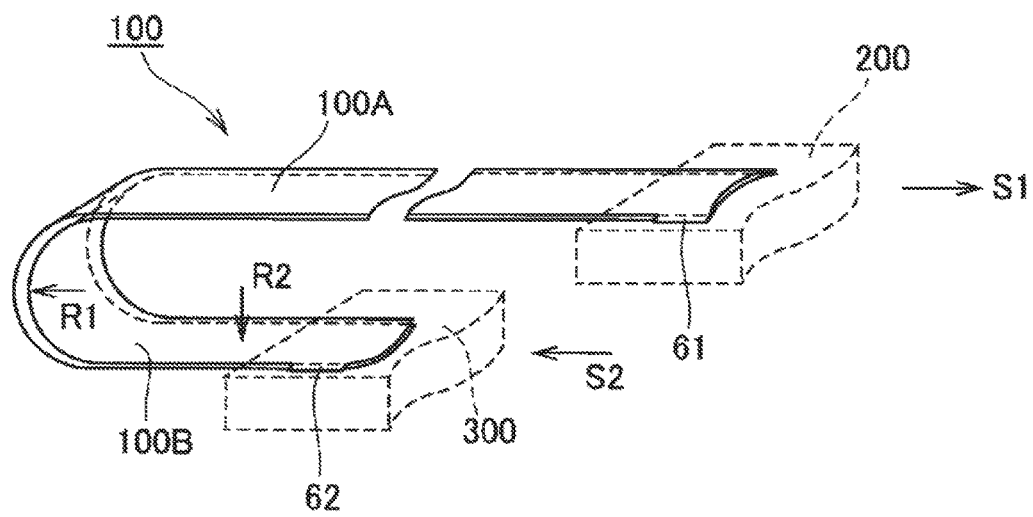
FIG. 2 is a perspective view illustrating the state during use of the flexible printed wiring board according to Embodiment I of the present disclosure.
Figure 3:
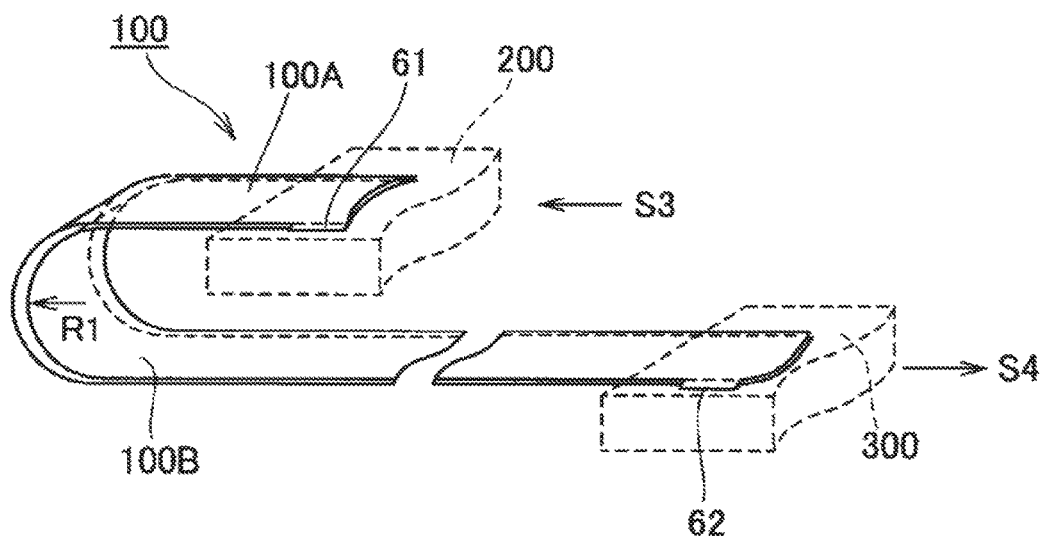
FIG. 3 is a perspective view illustrating the state during use of the flexible printed wiring board according to Embodiment I of the present disclosure.

A use example of the flexible printed wiring board 100 according to the present embodiment will be described particularly with reference to FIGS. 2 and 3. FIGS. 2 and 3 are perspective views illustrating the state during use of the flexible printed wiring board according to Embodiment 1 of the present disclosure.

The flexible printed wiring board 100 according to the present embodiment is used in a state in which the board is bent to be curved in the longitudinal direction, and one and another ends in the longitudinal direction are fixed respectively to one and another members that move in relation to each other. In this example, a case in which one and another ends in the longitudinal direction of the flexible printed wiring board 100 are fixed respectively to one and another members that reciprocate linearly in relation to each other will be described. The two members will be referred to as a first member 200 and a second member 300 for the sake of convenience. In FIGS. 2 and 3, these first and second members 200 and 300 are depicted by dot lines in a simplified manner.

As illustrated in the drawings, one end of the flexible printed wiring board 100 in the longitudinal direction is fixed to the first member 200 and the other end is fixed to the second member 300 in a state in which the board is bent to be curved in the longitudinal direction. In the flexible printed wiring board 100 according to the present embodiment, the first and second wiring board units 100A and 100B are molded in a state of being curved in the lateral direction. Therefore, in a state in which one and the other ends in the longitudinal direction are fixed, the flexible printed wiring board 100 does not sag and maintains a self-supported state.

FIG. 2 illustrates a state in which the first member 200 moves in the direction indicated by arrow S1 and the second member 300 moves in the direction indicated by arrow S2. FIG. 3 illustrates a state in which the first member 200 moves in the direction indicated by arrow S3 and the second member 300 moves in the direction indicated by arrow S4. In this manner, the first and second members 200 and 300 are configured to reciprocate linearly in relation to each other. With this movement, the position at which the flexible printed wiring board 100 is curved in the longitudinal direction also moves. The first and second wiring board units 100A and 100B are connected in a region excluding a region in which the position at which the wiring board units are curved in the longitudinal direction moves. In other words, the first and second wiring board units 100A and 100B are not connected in a region in which the position at which the wiring board units are curved in the longitudinal direction moves.

<Method for Manufacturing Flexible Printed Wiring Board>

A method for manufacturing the flexible printed wiring board according to the present embodiment will be described in order of manufacturing steps particularly with reference to FIGS. 4 to 10.

<<First Step>>

Figure 4:
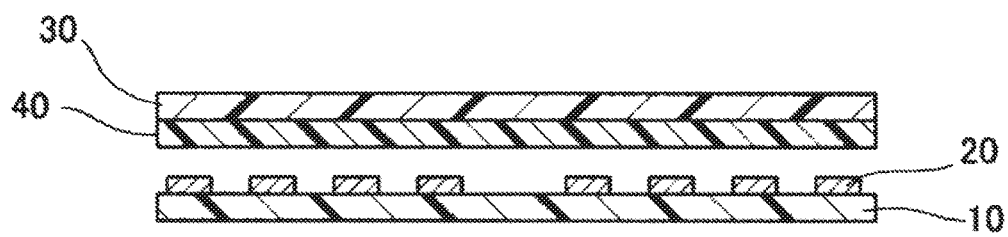
FIG. 4 is a diagram for describing the steps of manufacturing the flexible printed wiring board according to Embodiment 1 of the present disclosure.

A first step will be described with reference to FIG. 4. In FIG. 4, various constituent members for manufacturing a flexible printed wiring board are illustrated in a cross-sectional view. First, a single-side copper-clad laminate board having a copper foil layer (for example, a layer formed of copper foil having a thickness of 12 µm) on one surface of the flexible insulating substrate 10 is prepared. A preferred example of the insulating substrate 10 includes a film formed of a thermoplastic resin having a thickness of 50 µm. A preferred example of the thermoplastic resin includes a liquid crystal polymer (hereinafter referred to as LCP). The copper foil layer of the single-side copper-clad laminate board is subjected to an etching process based on a photo fabrication method whereby a wiring pattern is formed (see a cross-sectional view on the lower side of FIG. 4). In the drawings, reference numeral 20 indicates wires obtained by forming the wiring pattern.

Moreover, a coverlay in which openings for exposing terminal portions of the wires 20 are formed and which includes a flexible insulating coverlay film 30 and a coverlay adhesive 40 is prepared (see a cross-sectional view on the upper side of FIG. 4). An LCP film having a thickness of 50 µm may be used as the coverlay film 30 similarly to the insulating substrate 10. Moreover, a layer formed of an adhesive having a thickness of 15 µm, for example, may be used as the coverlay adhesive 40. The coverlay adhesive 40 preferably has a low modulus of elasticity so that no problem occurs during molding. Specifically, since an LCP film has a modulus of elasticity of approximately 3 to 4 GPa, it is preferable to use an adhesive having a modulus of elasticity (2 GPa or smaller) that is half that of the LCP film. In this way, the insulating substrate 10 and the coverlay can be bonded together without any adverse effect on moldability. Moreover, since molding involves heating for 30 minutes at a temperature of approximately 200° C., the coverlay adhesive 40 ideally has such a property that the adhesive property and the electrical insulation characteristic do not deteriorate remarkably under this thermal history.

<<Second Step>>

Figure 5:
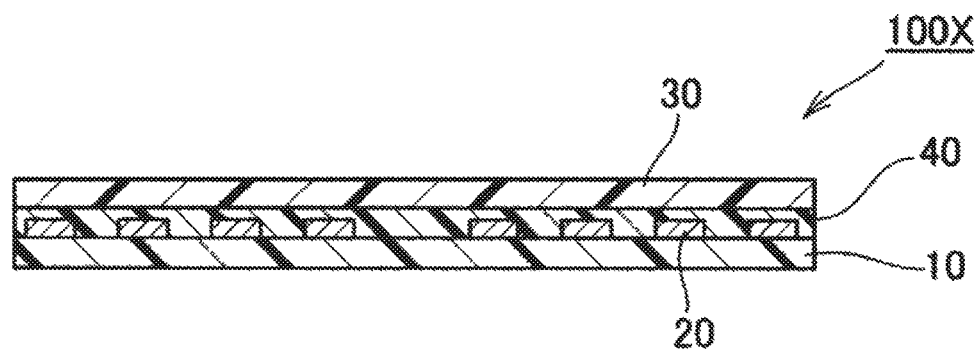
FIG. 5 is a diagram for describing the steps of manufacturing the flexible printed wiring board according to Embodiment 1 of the present disclosure.

A second step will be described with reference to FIG. 5 FIG. 5 illustrates a cross-sectional view of various constituent members for manufacturing the flexible printed wiring board. After the first step is completed, the coverlay is laminated on a surface of the insulating substrate 10 on which the wiring pattern including the plurality of wires 20 is formed, and the insulating substrate 10 is heated for approximately 1 to 2 hours at a temperature of 150° C. to 200° C. whereby hardening reaction of the coverlay adhesive 40 is completed. In this way, an intermediate product 100X in which the coverlay is laminated on the insulating substrate 10 is obtained.

<<Third Step>>

Figure 6:
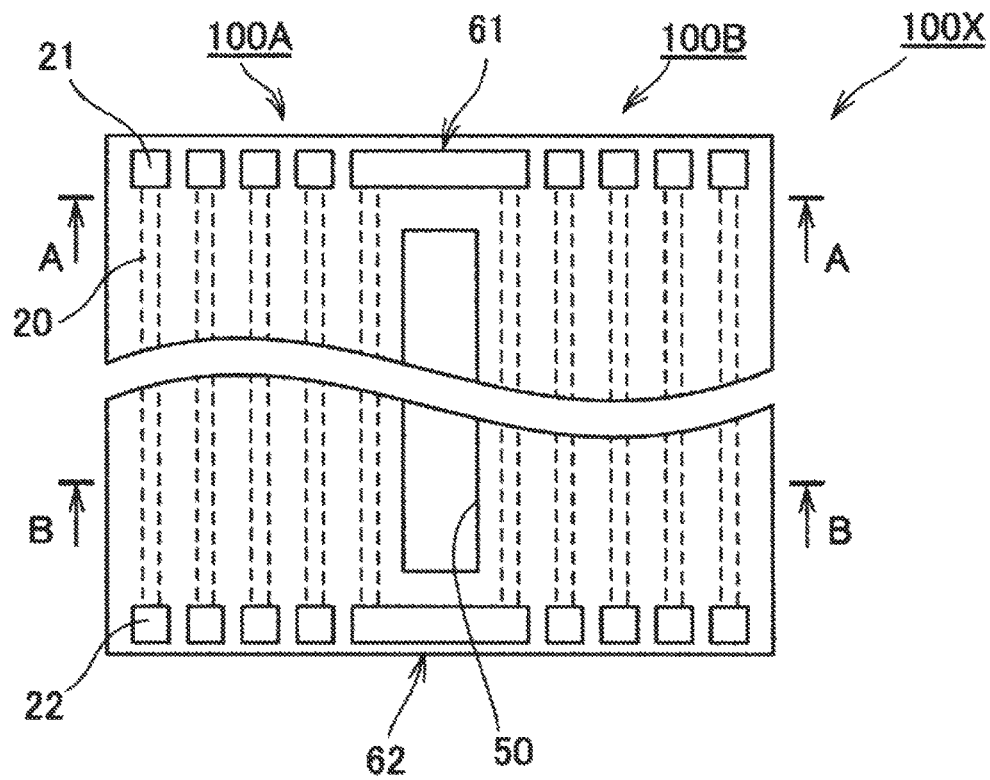
FIG. 6 is a diagram for describing the steps of manufacturing the flexible printed wiring board according to Embodiment 1 of the present disclosure.

A third step will be described with reference to FIG. 6. FIG. 6 illustrates a plan view of the intermediate product 100X obtained in the course of manufacturing the flexible printed wiring board 100. In this step, a rectangular slit 50 is formed by cutting at the center in the lateral direction of the intermediate product 100X. As a more specific example, the slit 50 of which the length in the longitudinal direction is 390 mm and the length in the lateral direction is 2 mm can be formed in the intermediate product 100X of which the length in the longitudinal direction is 400 mm and the length in the lateral direction is 62 mm so as to pass through the center in the lateral direction. Portions of the intermediate product 100X at the center in the lateral direction in which the slit 50 is not formed correspond to the first and second connection portions 61 and 62. Moreover, both sides of the slit 50 in the lateral direction correspond to the first and second wiring board units 100A and 100B. Moreover, the terminal portions 21 and 22 at both ends in the longitudinal direction of each wire 20 are exposed through the opening formed in the coverlay film 30. Furthermore, in the present embodiment, the first and second connection portions 61 and 62 are mechanically connected and are electrically connected by the wire 20. However, a configuration in which the connection portions are not electrically connected may be employed.

<<Fourth Step>>

Figure 7:
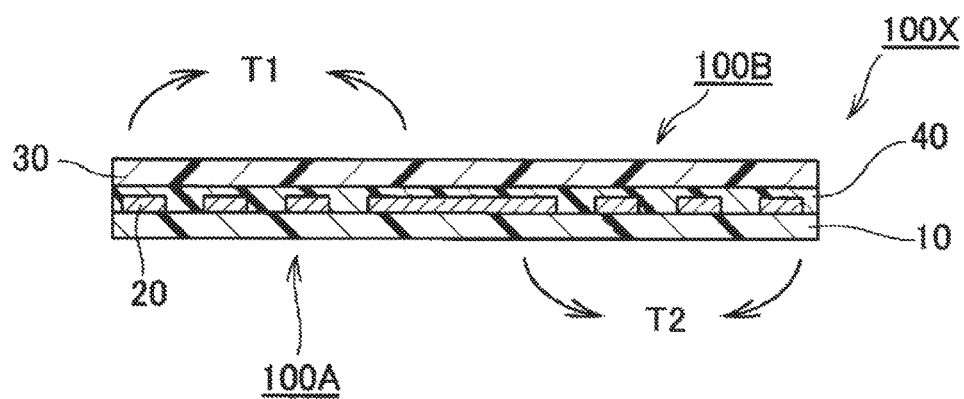
FIG. 7 is a diagram for describing the steps of manufacturing the flexible printed wiring board according to Embodiment 1 of the present disclosure.
Figure 8:
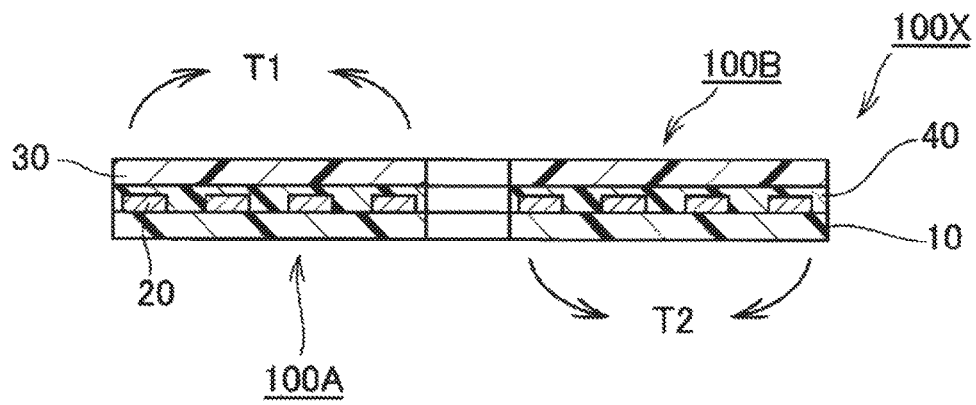
FIG. 8 is a diagram for describing the steps of manufacturing the flexible printed wiring board according to Embodiment 1 of the present disclosure.
Figure 9:
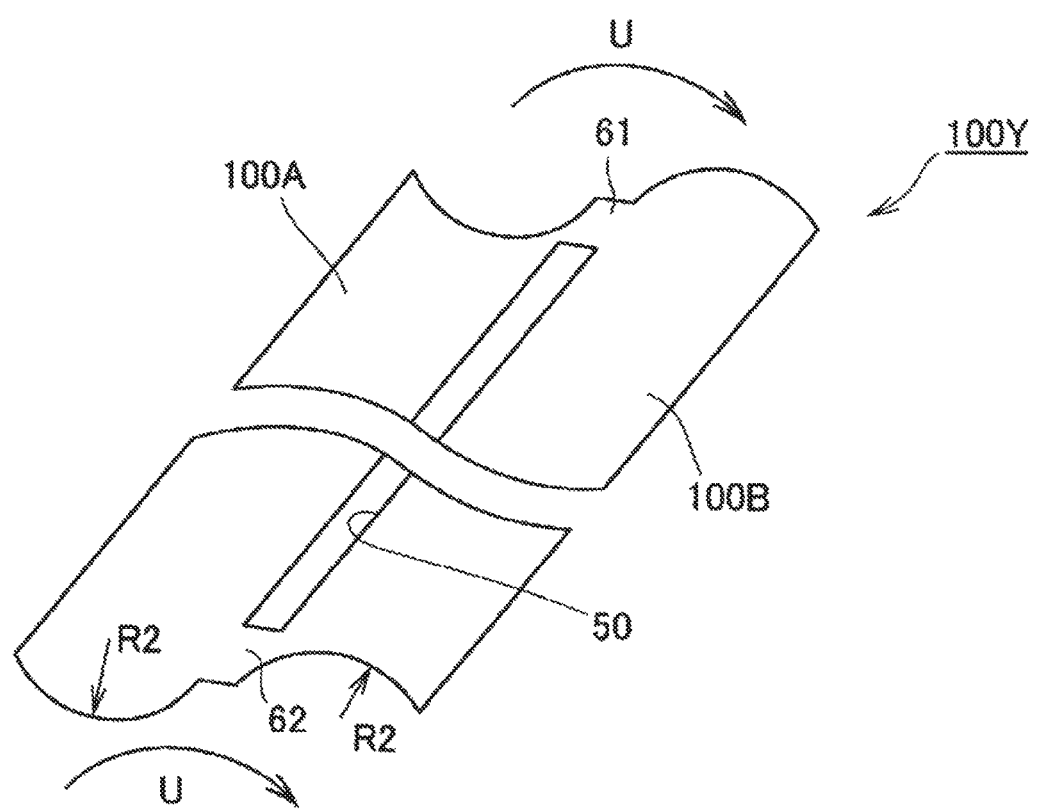
FIG. 9 is a diagram for describing the steps of manufacturing the flexible printed wiring board according to Embodiment 1 of the present disclosure.

A fourth step will be described with reference to FIGS. 7 and 8. FIG. 7 is a cross-sectional view along line A-A in FIG. 6 and FIG. 8 is a cross-sectional view along line B-B in FIG. 6. In the fourth step, the first and second wiring board units 100A and 100B are molded so as to be curved in the lateral direction. In the present embodiment, the first wiring board unit 100A is molded in a curved form so as to protrude toward the lower side in the drawing as indicated by arrow T1 in FIGS. 7 and 8. In contrast, the second wiring board unit 100B is molded in a curved form so as to protrude toward the upper side in the drawing as indicated by arrow T2 in FIGS. 7 and 8. More specifically, the wiring board unit can be molded in a curved form by heating the same for a predetermined period using an oven or the like in a state of being sandwiched by a jig having a predetermined shape (for example, a jig obtained by cutting a pipe along a center axis) from both surface sides of the wiring board unit. When the laminate board is formed of an LCP film, the wiring board unit can be molded by heating for approximately 30 minutes at a temperature of 200° C. FIG. 9 illustrates a perspective view of the intermediate product 100Y obtained by this step. In the present embodiment, the first and second wiring board units 100A and 100B are molded so that the radius of curvature R2 of the curved portion that is curved in the lateral direction is 15 mm.

<<Fifth Step>>

Figure 10:
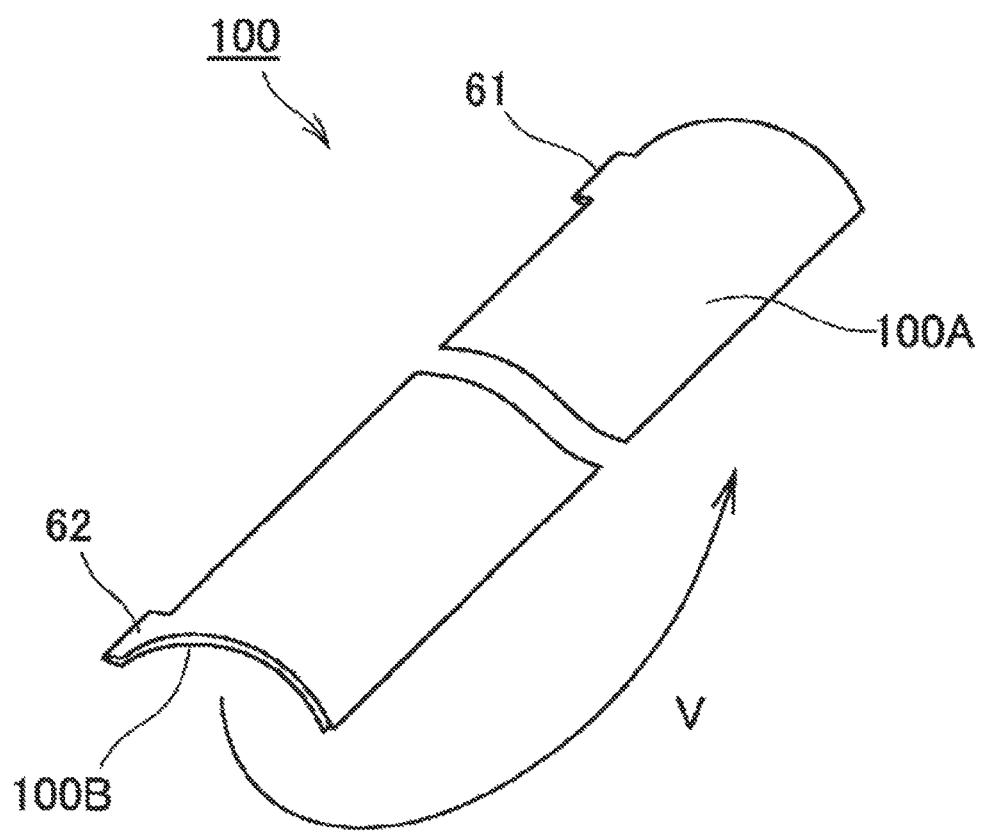
FIG. 10 is a perspective view of the flexible printed wiring board according to Embodiment 1 of the present disclosure.

A fifth step will be described with reference to FIG. 9. FIG. 9 illustrates a perspective view of an intermediate product 100Y obtained in the course of manufacturing the flexible printed wiring board. The first and second connection portions 61 and 62 of the intermediate product 100Y obtained by the fourth step are bent in the direction indicated by arrow U in the drawing so that the first and second wiring board units 100A and 100B overlap each other whereby the flexible printed wiring board 100 which is a final product is obtained. FIG. 10 illustrates a perspective view of the flexible printed wiring board 100.

<<Attachment Step>>

Attachment of the flexible printed wiring board 100 to various apparatuses will be described. In this example, a case in which the flexible printed wiring board 100 is attached to the first and second members 200 and 300 will be described. First, after one end in the longitudinal direction of the flexible printed wiring board 100 is fixed to the first member 200, the flexible printed wiring board 100 is bent in a curved form in the direction indicated by arrow V in FIG. 10 and the other end is fixed to the second member 300. In the flexible printed wiring board 100, the radius of curvature R1 of the curved portion that is bent to be curved in the longitudinal direction is 15 mm.

<Superiority of Flexible Printed Wiring Board According to Present Embodiment>

According to the flexible printed wiring board 100 of the present embodiment, since the first and second wiring board units 100A and 100B molded in a state of being curved in the lateral direction are connected, the radius of curvature R1 of the curved portion that is bent to be curved in the longitudinal direction can be decreased. That is, the radius of curvature R1 of the curved portion can be decreased to be approximately equal to the radius of curvature R2 of the curved portion that is curved in the lateral direction of the wiring board unit. In this way, it is possible to decrease the distance in the up-down direction of the flexible printed wiring board 100 in FIGS. 1 to 3. Therefore, it is possible to use the flexible printed wiring board 100 in a narrow arrangement space.

Moreover, since the first and second wiring board units 100A and 100B are molded in a state of being curved in the lateral direction, the wiring board units do not sag and can be self-supported in a state in which one and the other ends of the flexible printed wiring board 100 are supported. Moreover, since a plurality of wiring board units are connected, it is possible to increase the number of wires 20. Therefore, even when the flexible printed wiring board is used in a narrow arrangement space, it is possible to increase the number of wires 20 and to increase the degree of freedom for design.

In the present embodiment, the first and second wiring board units 100A and 100B are connected in a region excluding a region in which the position at which the wiring board units are curved in the longitudinal direction moves. That is, the first and second wiring board units 100A and 100B are not connected in a region in which the position at which the wiring board units are curved in the longitudinal direction moves. Therefore, it is possible to suppress the first and second wiring board units 100A and 100B from applying a load to each other and to suppress damage to the respective wiring board units.

Furthermore, in the present embodiment, the first and second wiring board units 100A and 100B are configured so that the curved portions in the lateral direction protrude in different directions, and the first and second connection portions 61 and 62 are bent so that the wiring board units overlap each other. Therefore, it is possible to narrow the width (the width in the lateral direction) of the entire flexible printed wiring board 100.

Here, a test for moving the first and second members 200 and 300 to reciprocate linearly for 50 million times was performed on the flexible printed wiring board 100 having the above-described configuration. According to the test result, a change in a DC resistance of the wire 20 was 3% or smaller. Moreover, since the flexible printed wiring board 100 was not deformed and the first and second wiring board units 100A and 100B did not slide against each other, no abrasion caused by sliding was observed.

Moreover, when the wiring board unit on which a ground layer is present is disposed on the outer side, it is possible to enhance a noise shielding property. In the present embodiment, when the first wiring board unit 100A is used as a ground and the second wiring board unit 100B is used as a signal line, it is possible to provide a high shielding property for the signal line and to reduce the influence of noise entering the signal line.

Embodiment 2

FIGS. 11 to 15 illustrate Embodiment 2 of the present disclosure. Embodiment 1 illustrates a configuration in which two wiring board units are provided. The present embodiment illustrates a configuration in which three wiring board units are provided. Basic configuration and effects are the same as those of Embodiment 1, and the same constituent elements will be denoted by the same reference numerals and the description thereof will be omitted appropriately.

Figure 13:
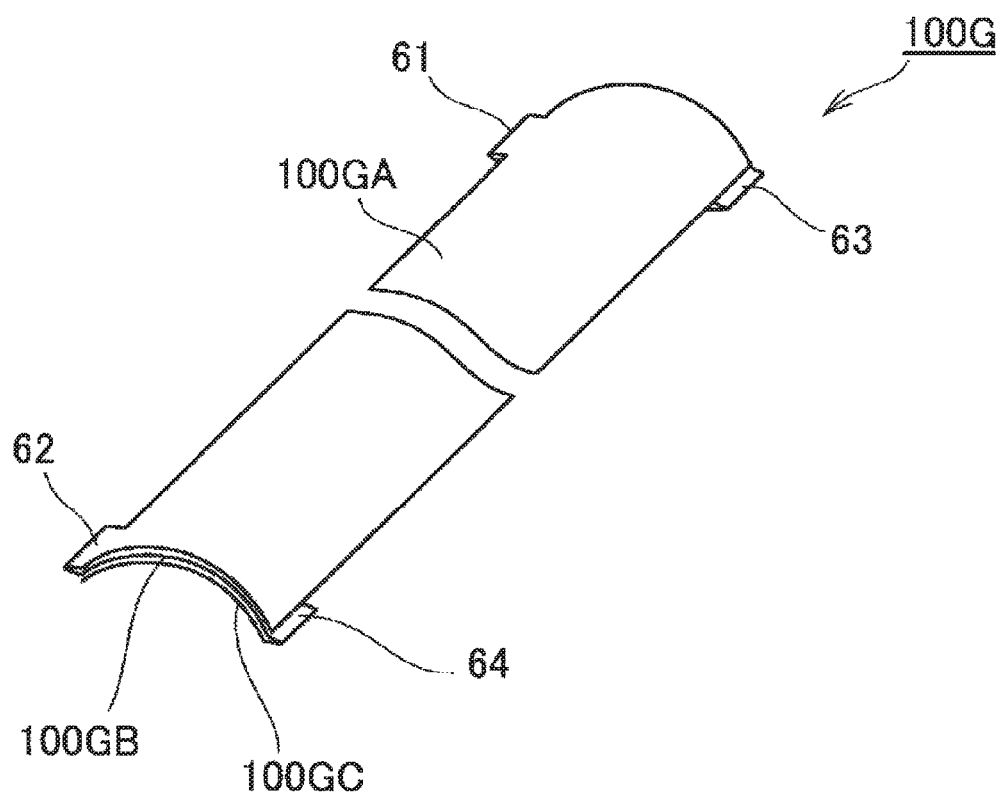
FIG. 13 is a perspective view of the flexible printed wiring board according to Embodiment 2 of the present disclosure.

A flexible printed wiring board 100G according to the present embodiment is used in a state of being bent to be curved in the longitudinal direction. The use method of the flexible printed wiring board 100G is similar to Embodiment 1, and the description will be omitted. In the flexible printed wiring board 100G according to the present embodiment, a configuration in which the flexible printed wiring board includes three wiring board units in which a plurality of wires are formed in a flexible insulating substrate and which are molded in a state of being curved in the lateral direction is employed. Hereinafter, these three wiring board units will be referred to as a first wiring board unit 100GA, a second wiring board unit 100GB, and a third wiring board unit 100GC for the sake of convenience. FIG. 13 is a perspective view of the flexible printed wiring board 100G according the present embodiment. Moreover, the radius of curvature R2 of the first wiring board unit 100GA, the radius of curvature R2 of the second wiring board unit 100GB, and the radius of curvature R2 of the third wiring board unit 100GC are designed to be equal to each other. Therefore, the radii of curvature of the curved portions that are curved in the lateral direction of the wiring board units are approximately the same.

The first and second wiring board units 100GA and 100GB which are adjacent to each other are partially connected at side edges in the lateral direction, and the second and third wiring board units 100GB and 100GC which are adjacent to each other are partially connected at side edges in the lateral direction. More specifically, these first and second wiring board units 100GA and 100GB are connected at side edges in the lateral direction near both ends in the longitudinal direction, and these second and third wiring board units 100GB and 100GC are connected at side edges in the lateral direction near both ends in the longitudinal direction. Hereinafter, these connection portions will be referred to as a first connection portion 61, a second connection portion 62, a third connection portion 63, and a fourth connection portion 64 for the sake of convenience. In the flexible printed wiring board 100G according to the present embodiment, these first and second connection portions 61 and 62 are bent and the third and fourth connection portions 63 and 64 are bent whereby the first, second, and third wiring board units 100GA, 100GB, and 100GC overlap each other.

Figure 11:
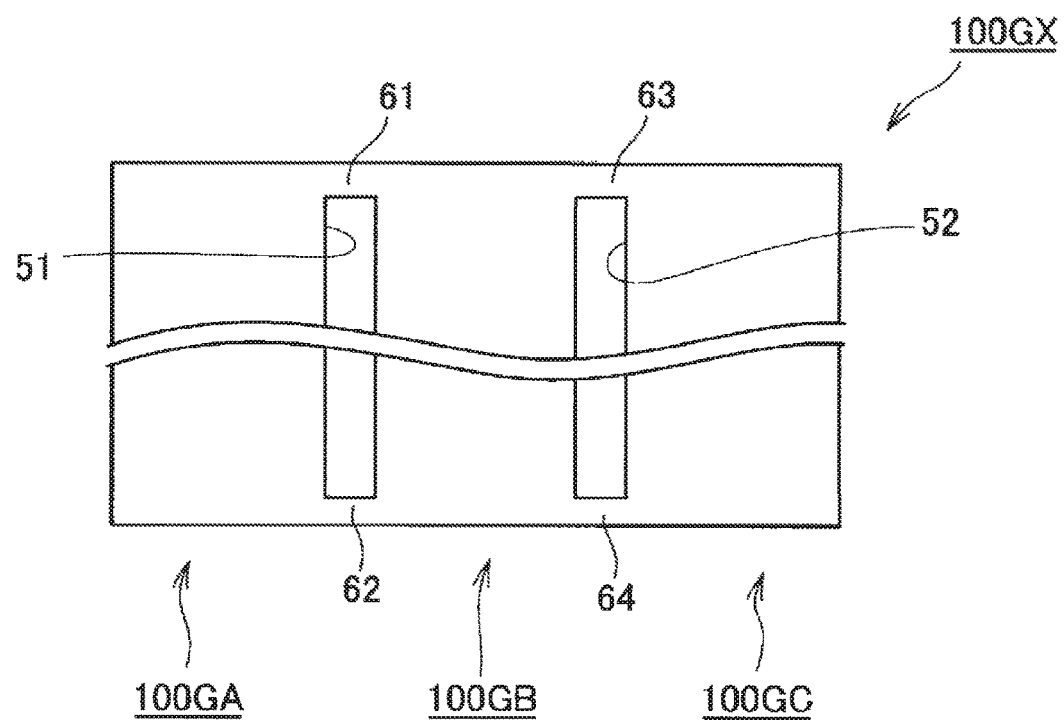
FIG. 11 is a diagram for describing the steps of manufacturing a flexible printed wiring board according to Embodiment 2 of the present disclosure.

Next, a method for manufacturing the flexible printed wiring board 100G according to the present embodiment will be described. An intermediate product 100GX is manufactured by steps similar to the first and second steps described in Embodiment 1. FIG. 11 illustrates a plan view of the intermediate product 100GX obtained in the course of manufacturing the flexible printed wiring board 100G. In the present embodiment, two rectangular slits 51 and 52 are formed by cutting in the intermediate product 100GX. As a more specific example, two slits 51 and 52 of which the length in the longitudinal direction is 390 mm and the length in the lateral direction is 2 mm can be formed at an interval of 30 mm in the lateral direction in the intermediate product 100GX of which the length in the longitudinal direction is 400 mm and the length in the lateral direction is 94 mm. Both sides of the slit 51 in the lateral direction correspond to the first and second wiring board units 100GA and 100GB, and both sides of the slit 52 in the lateral direction correspond to the second and third wiring board units 100GB and 100GC. In FIG. 11, the wires 20 are not depicted. In the present embodiment, the first, second, third, and fourth connection portions 61, 62, 63, and 64 may be mechanically connected and may be electrically connected by the wire 20. Moreover, a configuration in which the connection portions are not electrically connected may be employed.

After the slits 51 and 52 are formed, as described above in the fourth step of Embodiment 1, the wiring board units are molded in a state of being curved in the lateral direction. In the present embodiment, the first and third wiring board units 100GA and 100GC are molded in a curved form so as to protrude toward the lower side in FIG. 12. In contrast, the second wiring board unit 100GB is molded in a curved form so as to protrude toward the upper side in FIG. 12. A specific molding method is similar to that described in Embodiment 1. In the present embodiment, the respective wiring board units are molded so that the radius of curvature R2 of the curved portion that is curved in the lateral direction is 15 mm. Therefore, although not illustrated particularly, the radius of curvature R1 of the curved portion that is bent so that the flexible printed wiring board 100G is curved in the longitudinal direction during use is set to 15 mm.

Figure 12:
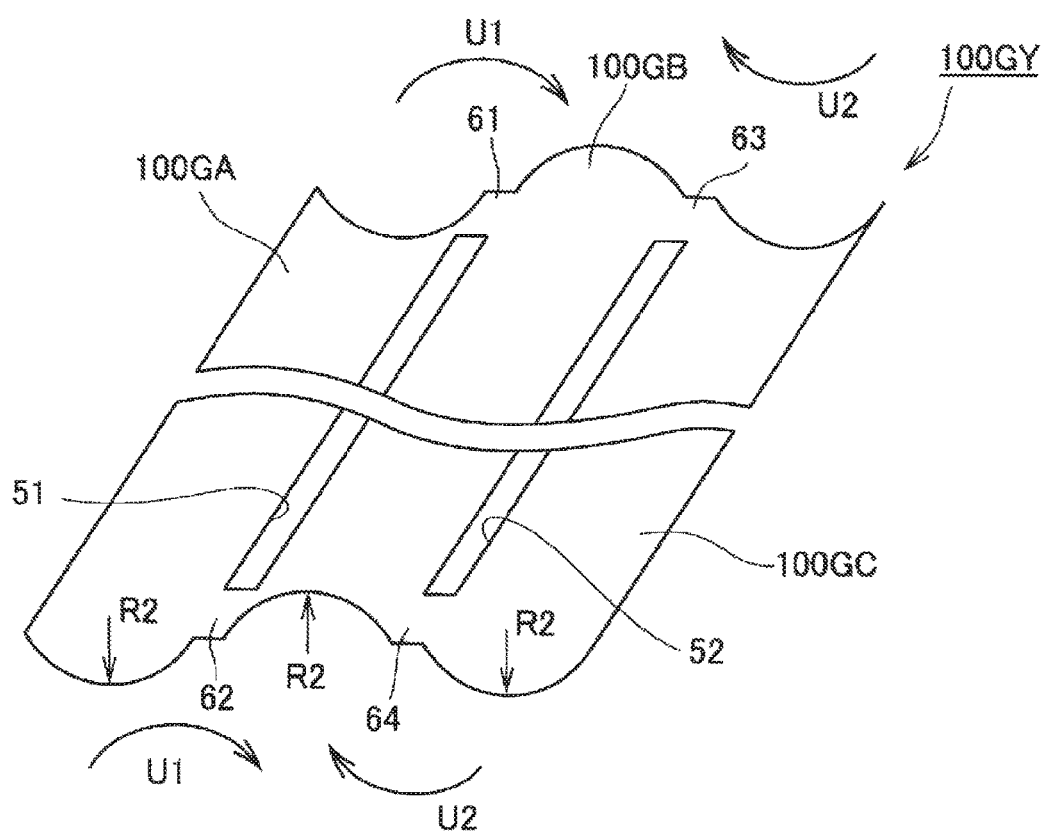
FIG. 12 is a diagram for describing the steps of manufacturing the flexible printed wiring board according to Embodiment 2 of the present disclosure.

FIG. 12 illustrates a perspective view of an intermediate product 100GY obtained in the course of manufacturing the flexible printed wiring board. The first and second connection portions 61 and 62 of the intermediate product 100GY obtained by the molding are bent in the direction indicated by arrow U1 in the drawing, and the third and fourth connection portions 63 and 64 are bent in the direction indicated by arrow U2 in the drawing. In this way, the first, second, and third wiring board units 100GA, 100GB, and 100GC overlap each other whereby the flexible printed wiring board 100G which is a final product is obtained. FIG. 13 illustrates a perspective view of the flexible printed wiring board 100G. In FIG. 13, the first wiring board unit 100GA is at the top, the second wiring board unit 100GB is in the middle, and the third wiring board unit 100GC is at the bottom.

Figure 14:
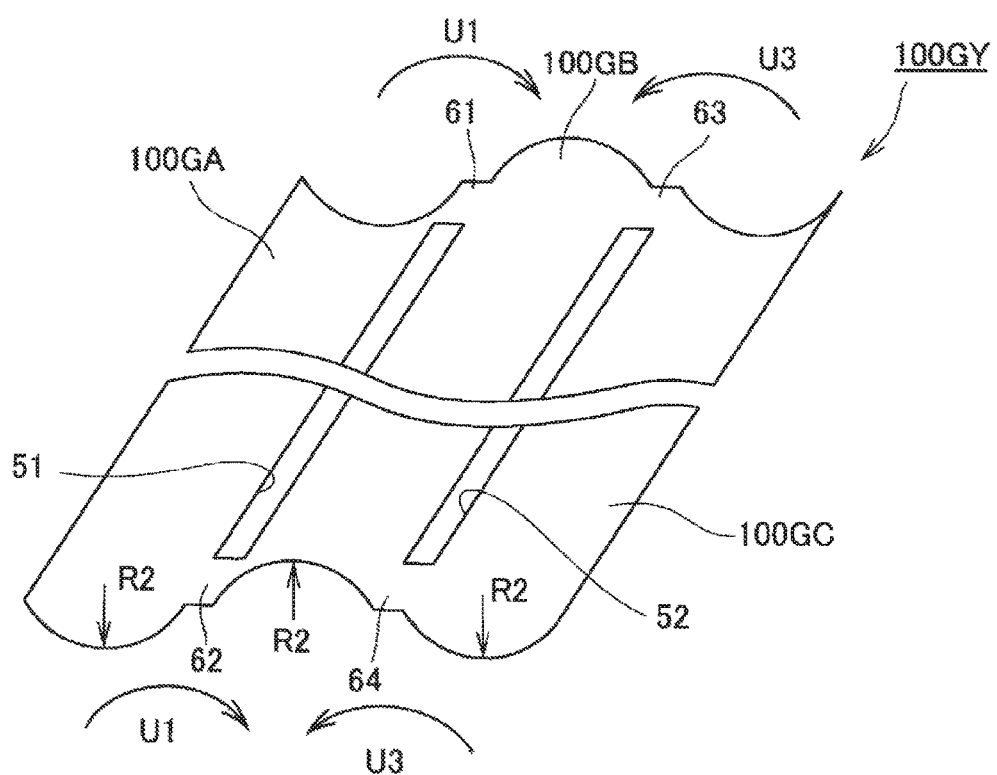
FIG. 14 is a diagram for describing the steps of manufacturing the flexible printed wiring board according to a modification of Embodiment 2 of the present disclosure.
Figure 15:
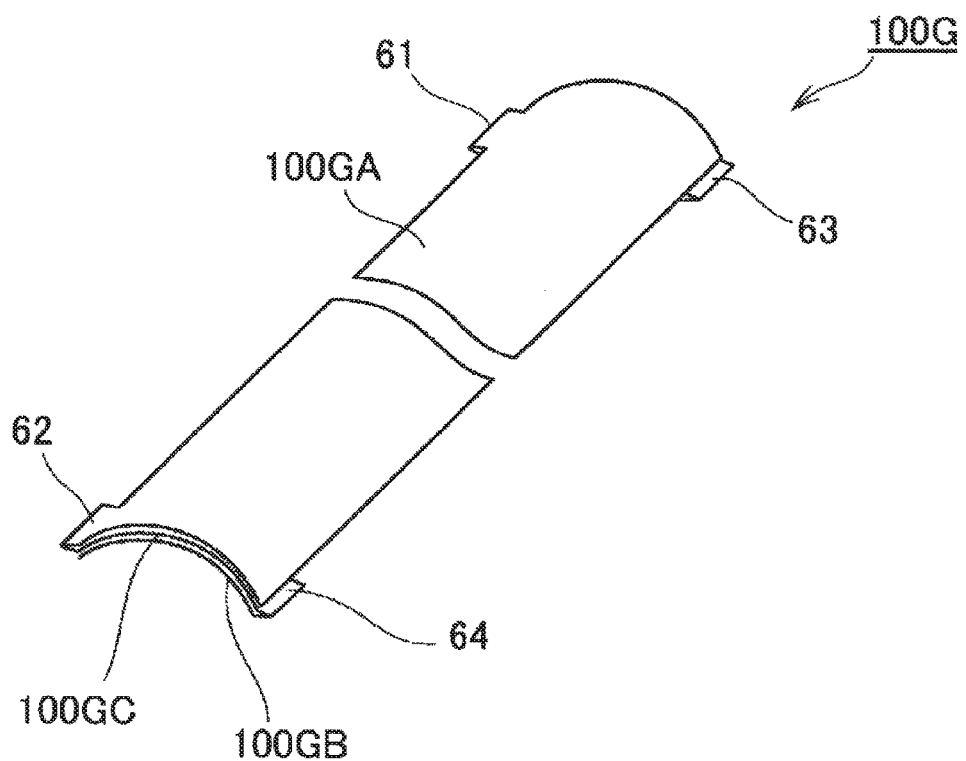
FIG. 15 is a perspective view of the flexible printed wiring board according to a modification of Embodiment 2 of the present disclosure.

A bending method is not limited to the above-described method. For example, as illustrated in FIG. 14, after the third and fourth connection portions 63 and 64 of the intermediate product 100GY obtained by the molding are bent in the direction indicated by arrow U3 in the drawing, the first and second connection portions 61 and 62 may be bent in the direction indicated by arrow U1 in the drawing. In this case, the first, second, and third wiring board units 100GA, 100GB, and 100GC overlap each other whereby the flexible printed wiring board 100G which is a final product can be obtained. FIG. 15 illustrates a perspective view of the flexible printed wiring board 100G obtained by the bending method illustrated in FIG. 14. In FIG. 15, the first wiring board unit 100GA is at the top, the third wiring board unit 100GC is in the middle, and the second wiring board unit 100GB is at the bottom.

In the flexible printed wiring board 100G according to the present embodiment having the above-described configuration, it is possible to obtain the same advantages as those of Embodiment 1. Moreover, in the present embodiment, since three wiring board units are provided, it is possible to further increase the number of wires. Moreover, when the wiring board unit on which a ground layer is present is disposed on the outer side, it is possible to enhance a noise shielding property. That is, in the example illustrated in FIG. 13, when the first and third wiring board units 100GA and 100GC are used as a ground and the second wiring board unit 100GB is used as a signal line, it is possible to provide a high shielding property for the signal line and to reduce the influence of noise entering the signal line. Moreover, in a modification illustrated in FIG. 15, when the first and second wiring board units 100A and 100GB are used as a ground and the third wiring board unit 100GC is used as a signal line, it is possible to provide a high shielding property for the signal line and to reduce the influence of noise entering the signal line and noise radiating from the signal line. Moreover, since wires may be divided into a power line and a signal line and the ground may be disposed between the power line and the signal line, a countermeasure for preventing power noise from having an adverse effect on signal quality may be taken.

The flexible printed wiring board 100G according to the present embodiment was fixed to the first and second members 200 and 300 illustrated in Embodiment 1, and a test for moving the first and second members to reciprocate linearly for 50 million times was performed. According to the test result, a change in a DC resistance of the wire was 3% or smaller for the flexible printed wiring board 100G according to the present embodiment. Moreover, the flexible printed wiring board 100G was not deformed and no abrasion of the respective wiring board units was observed.

In the flexible printed wiring board 100G according to the present embodiment, although a case in which three wiring board units are provided is illustrated, the flexible printed wiring board of the present disclosure may employ a configuration in which the board includes four or more wiring board units. In this case, the curved portions in the lateral direction of the adjacent wiring board units may protrude in different directions. By doing so, when connection portions connected by the adjacent wiring board units are bent, a plurality of wiring board units overlap each other.

Embodiment 3

FIGS. 16 to 21 illustrate Embodiment 3 of the present disclosure. In the above-described embodiments, a configuration in which a plurality of wiring board units overlap each other has been illustrated. However, the present embodiment illustrates a configuration in which wiring board units do not overlap each other. Basic configuration and effects are the same as those of Embodiment 1, and the same constituent elements will be denoted by the same reference numerals and the description thereof will be omitted appropriately.

<Configuration of Flexible Printed Wiring Board>

Figure 16:
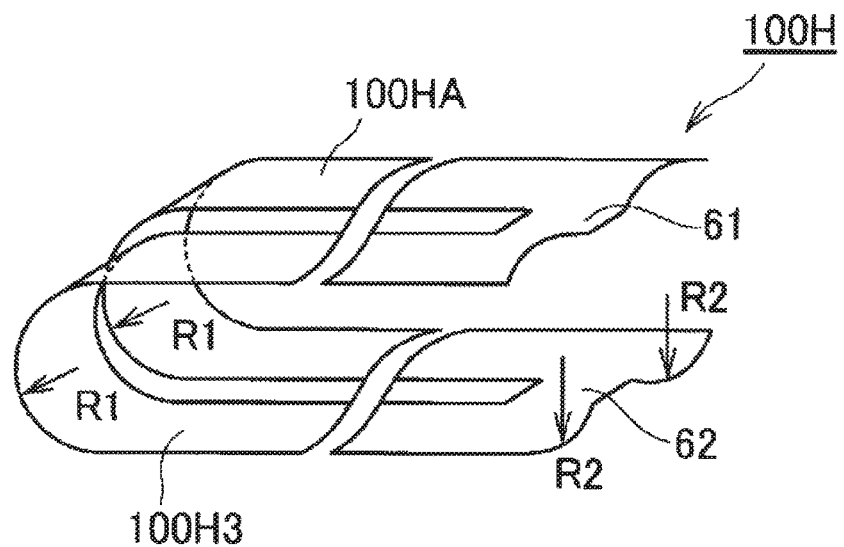
FIG. 16 is a perspective view of a flexible printed wiring board according to Embodiment 3 of the present disclosure.

A configuration of a flexible printed wiring board according to the present embodiment will be described particularly with reference to FIG. 16. FIG. 16 is a perspective view of a flexible printed wiring board according to Embodiment 3 of the present disclosure.

A flexible printed wiring board 100H according to the present embodiment is also used in a state of being bent to be curved in a longitudinal direction. The flexible printed wiring board 100H according to the present embodiment employs a configuration in which a plurality of wires are formed on a flexible insulating substrate and the board includes two wiring board units molded in a state of being curved in the lateral direction. Hereinafter, these two wiring board units will be referred to as a first wiring board unit 100HA and a second wiring board unit 100HB for the sake of convenience. In the present embodiment, the radius of curvature R2 in the first wiring board unit 100HA and the radius of curvature R2 in the second wiring board unit 100HB are designed to be equal to each other. Therefore, the radii of curvature of the curved portions that are curved in the lateral direction of the wiring board units are approximately the same.

The first and second wiring board units 100HA and 100HB which are adjacent to each other are partially connected by the first and second connection portions 61 and 62 at side edges in the lateral direction. In the flexible printed wiring board 100H according to the present embodiment, the first and second connection portions 61 and 62 are not bent and the first and second wiring board units 100HA and 100HB do not overlap each other.

<Use Example of Flexible Printed Wiring Board>

Figure 17:
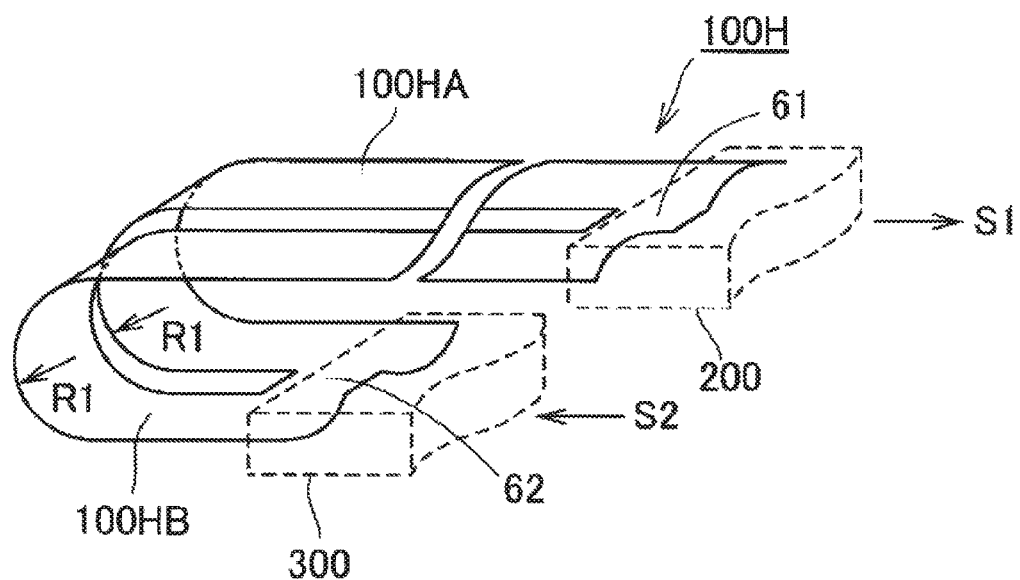
FIG. 17 is a perspective view illustrating the state during use of the flexible printed wiring board according to Embodiment 3 of the present disclosure.

A use example of the flexible printed wiring board 100H according to the present embodiment will be described particularly with reference to FIG. 17. FIG. 17 is a perspective view illustrating the state during use of the flexible printed wiring board according to Embodiment 3 of the present disclosure.

The flexible printed wiring board 100H according to the present embodiment is used in a state in which the board is bent to be curved in the longitudinal direction, and one and another ends in the longitudinal direction are fixed respectively to one and another members that move in relation to each other. In the present embodiment, a case in which one and another ends in the longitudinal direction of the flexible printed wiring board 100H are fixed respectively to the first and second members 200 and 300 that reciprocate linearly in relation to each other will be described.

As illustrated in the drawings, one end of the flexible printed wiring board 100H in the longitudinal direction is fixed to the first member 200 and the other end is fixed to the second member 300 in a state in which the board is bent to be curved in the longitudinal direction. In the flexible printed wiring board 100H according to the present embodiment, the first and second wiring board units 100HA and 100HB are molded in a state of being curved in the lateral direction. Therefore, in a state in which one and another ends in the longitudinal direction are fixed, the flexible printed wiring board 100H does not sag and maintains a self-supported state.

FIG. 17 illustrates a state in which the first member 200 moves in the direction indicated by arrow S1 and the second member 300 moves in the direction indicated by arrow S2. As described in Embodiment 1, when the first and second members 200 and 300 move in relation to each other, the position at which the flexible printed wiring board 100H is curved in the longitudinal direction also moves. In the present embodiment, the first and second wiring board units 100HA and 100HB are connected in a region excluding a region in which the position at which the wiring board units are curved in the longitudinal direction moves.

<Method for Manufacturing Flexible Printed Wiring Board>

A method for manufacturing the flexible printed wiring board according to the present embodiment will be described in order of manufacturing steps particularly with reference to FIGS. 18 to 21.

The first and second steps are similar to those of Embodiment 1. With these steps, an intermediate product 100HX is obtained.

<<Third Step>>

Figure 18:
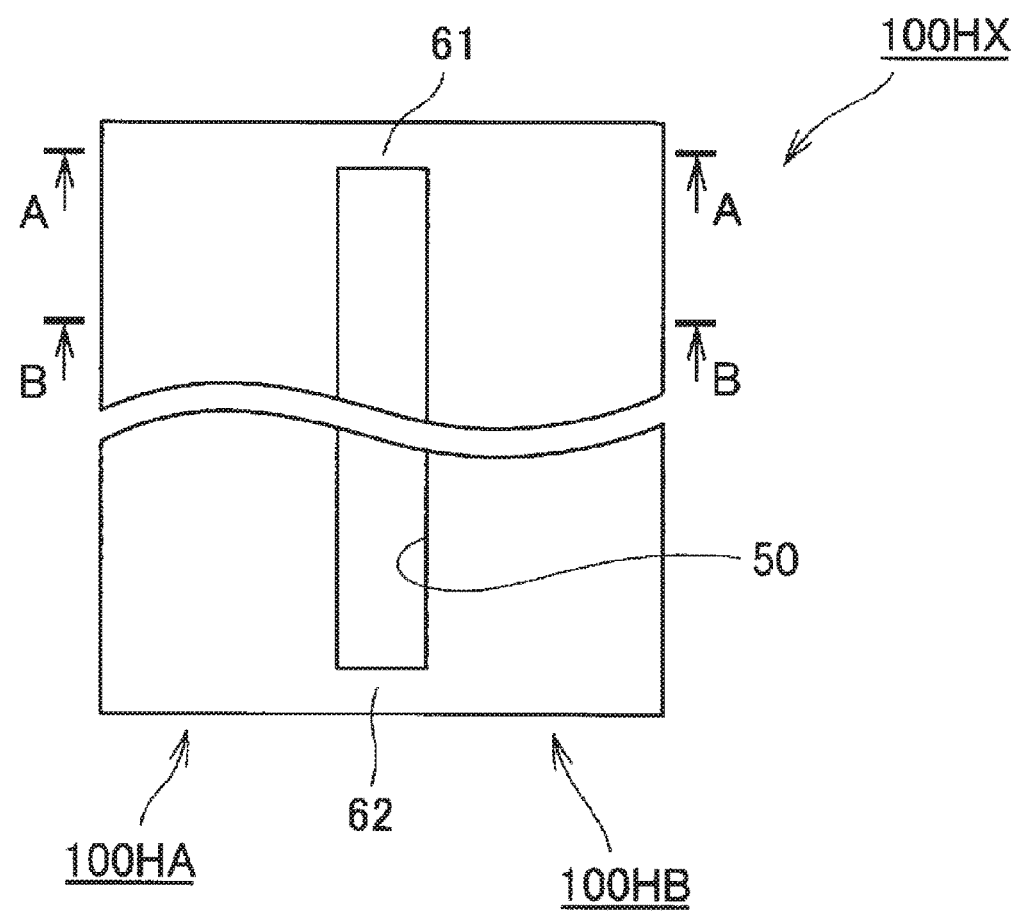
FIG. 18 is a diagram for describing the steps of manufacturing the flexible printed wiring board according to Embodiment 3 of the present disclosure.

A third step will be described with reference to FIG. 18. FIG. 18 illustrates a plan view of the intermediate product 100HX obtained in the course of manufacturing the flexible printed wiring board 100H. In this step, a rectangular slit 50 is formed by cutting at the center in the lateral direction of the intermediate product 100HX. As a more specific example, the slit 50 of which the length in the longitudinal direction is 390 mm and the length in the lateral direction is 2 mm can be formed in the intermediate product 100HX of which the length in the longitudinal direction is 400 mm and the length in the lateral direction is 42 mm so as to pass through the center in the lateral direction. Portions of the intermediate product 100HX at the center in the lateral direction in which the slit 50 is not formed correspond to the first and second connection portions 61 and 62. Moreover, both sides of the slit 50 in the lateral direction correspond to the first and second wiring board units 100HA and 100HB. In FIG. 18, the wires 20 are not illustrated. In the present embodiment, the first and second connection portions 61 and 62 may be mechanically connected and may be electrically connected by the wire 20. Moreover, a configuration in which the connection portions are not electrically connected may be employed.

<<Fourth Step>>

Figure 19:
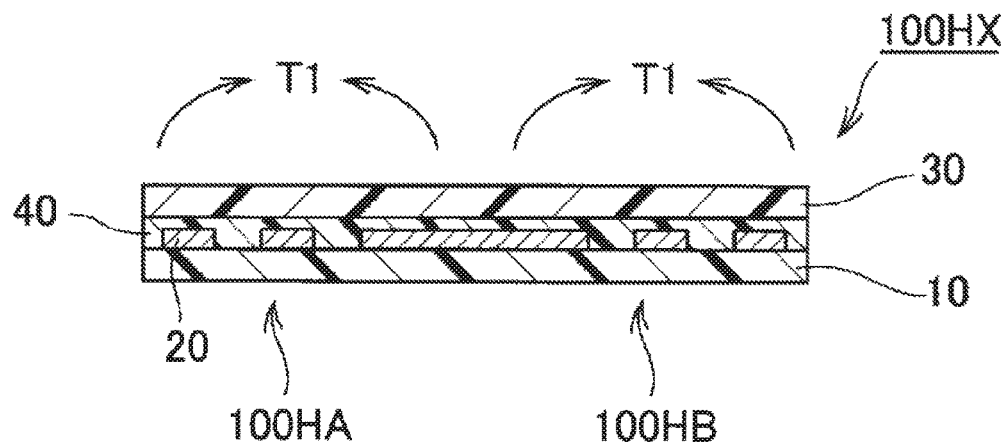
FIG. 19 is a diagram for describing the steps of manufacturing the flexible printed wiring board according to Embodiment 3 of the present disclosure.
Figure 20:
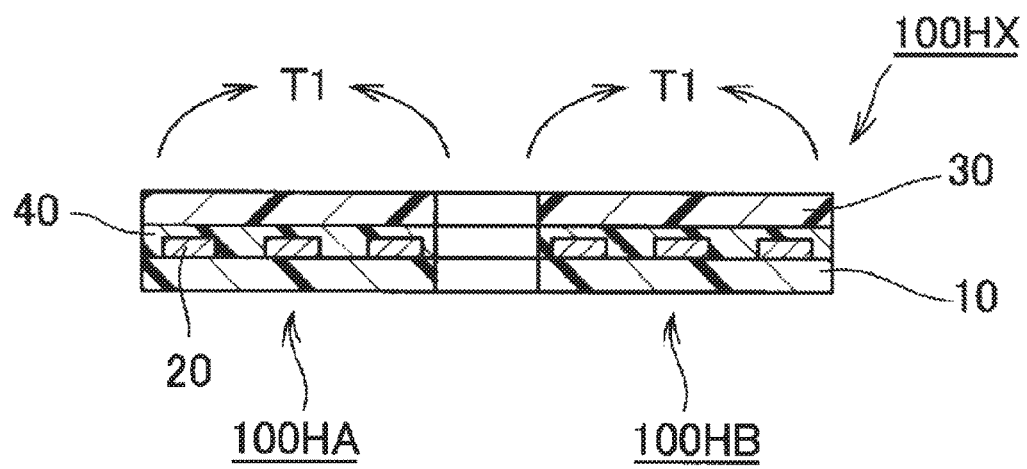
FIG. 20 is a diagram for describing the steps of manufacturing the flexible printed wiring board according to Embodiment 3 of the present disclosure.
Figure 21:
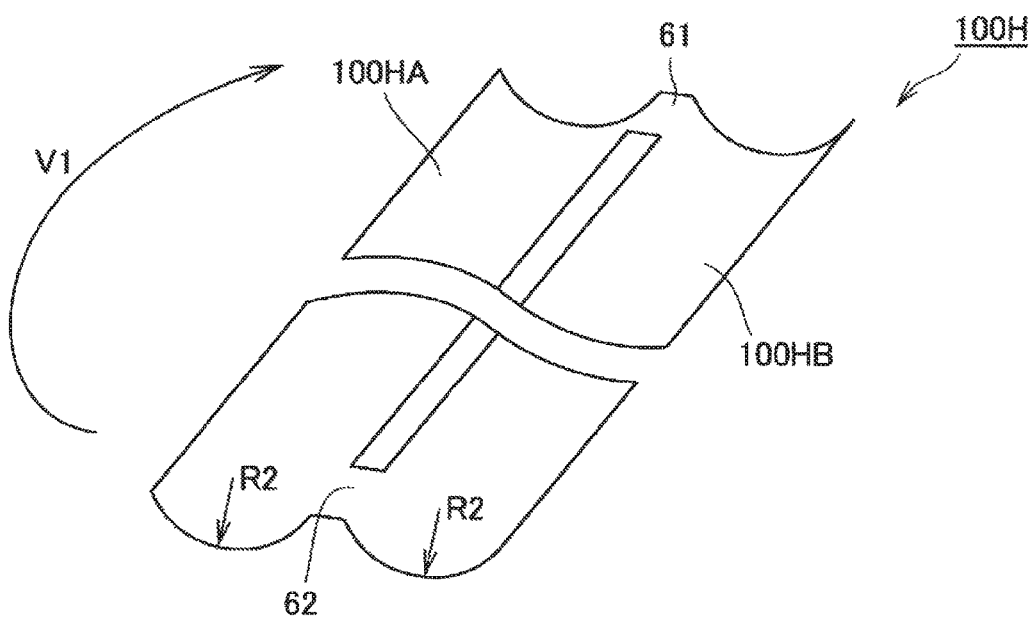
FIG. 21 is a perspective view of the flexible printed wiring board according to Embodiment 3 of the present disclosure.
Figure 22:
FIG. 22 is a perspective view of an ordinary flexible printed wiring board.
Figure 23:
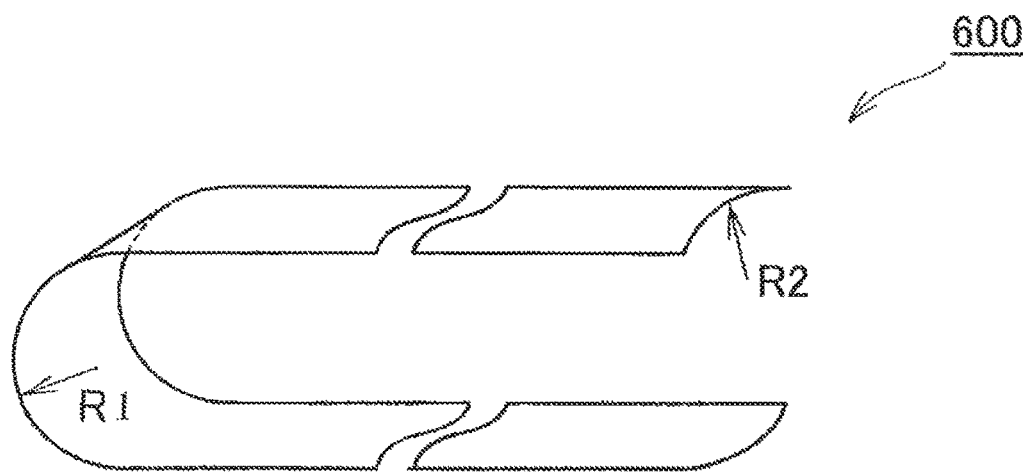
FIG. 23 is a perspective view of a flexible printed wiring board according to a related art.

A fourth step will be described with reference to FIGS. 19 and 20. FIG. 19 is a cross-sectional view along line A-A in FIG. 18 and FIG. 20 is a cross-sectional view along line B-B in FIG. 19. In the fourth step, the first and second wiring board units 100HA and 100HB are molded so as to be curved in the lateral direction In the present embodiment, both first and second wiring board units 100HA and 100HB are molded in a curved form so as to protrude toward the lower side in the drawing as indicated by arrow T1 in the drawing. A specific molding method is similar to that described in Embodiment 1. FIG. 21 illustrates a perspective view of the flexible printed wiring board 100H which is a final product obtained by this step.

In the present embodiment, the first and second wiring board units 100HA and 100HB are molded so that the radius of curvature R2 of the curved portion that is curved in the lateral direction is 10 mm. Therefore, the radius of curvature R1 (see FIGS. 16 and 17) of the curved portion that is bent so that the flexible printed wiring board 100H is curved in the longitudinal direction during use is set to 10 mm. The manufacturing steps of the present embodiment do not include a step corresponding to the fifth step of Embodiment 1.

<<Attachment Step>>

Attachment of the flexible printed wiring board 100H according to the present embodiment to various apparatuses will be described. In this example, a case in which the flexible printed wiring board 100H is attached to the first and second members 200 and 300 will be described. First, after the other end in the longitudinal direction of the flexible printed wiring board 100H is fixed to the second member 300, the flexible printed wiring board 100H is bent in a curved form in the direction indicated by arrow V1 in FIG. 21 and one end is fixed to the first member 200.

<Superiority of Flexible Printed Wiring Board According to Present Embodiment>

In the flexible printed wiring board 100H according to the present embodiment having the above-described configuration, it is possible to obtain the same advantages as those of Embodiment 1. However, since the present embodiment does not employ a configuration in which the wiring board units overlap each other, it is not possible to narrow the width (the width in the lateral direction) of the entire flexible printed wiring board 100H. Therefore, although the arrangement space of the flexible printed wiring board 100H is narrow in the height direction, when the width is wide, it is possible to effectively utilize the flexible printed wiring board 100H according to the present embodiment.

The flexible printed wiring board 100H according to the present embodiment was fixed to the first and second members 200 and 300 illustrated in Embodiment 1, and a test for moving the first and second members to reciprocate linearly for 50 million times was performed. According to the test result, a change in a DC resistance of the wire was 3% or smaller for the flexible printed wiring board 100H according to the present embodiment. Moreover, the flexible printed wiring board 100H was not deformed.

(Others)

Although Embodiments 1 and 2 illustrate a case in which all wiring board units overlap each other and Embodiment 3 illustrates a case in which all wiring board units do not overlap each other, a configuration in which some of the plurality of wiring board units overlap each other may be employed. For example, a configuration in which only two of three wiring board units overlap each other may be employed, or two wiring board units on one side in the lateral direction among four wiring board units may overlap each other and two wiring board units on the other side may overlap each other. In such a case, how the protruding directions formed by the curves in the lateral direction of the respective wiring board units will be set is apparent from the description of the respective embodiments, and the description thereof will not be provided.

In the respective embodiments, although a case in which the flexible printed wiring board is applied to two members that reciprocate linearly in relation to each other has been described, the flexible printed wiring board of the present disclosure is not limited to such a use. For example, the flexible printed wiring board of the present disclosure may be applied to two members that move closer to or away from each other. For example, although in the example illustrated in FIG. 2, two members reciprocate linearly in relation to each other in the left-right direction in the drawing, the flexible printed wiring board of the present disclosure may be applied to when two members reciprocate linearly in relation to each other in the front-rear direction of the drawing sheet. Furthermore, the flexible printed wiring board of the present disclosure may be applied to a case in which the movements of the two members are combined appropriately. Moreover, the flexible printed wiring board of the present disclosure may be applied to a case in which only one of the two members moves as well as a case in which both two members move in relation to each other.

In the respective embodiments, a case in which the insulating substrate and the coverlay film are formed of a thermoplastic resin so that the wiring board unit is molded to be curved in the lateral direction by heating has been described. However, a method of molding the wiring board unit so as to be curved in the lateral direction is not limited to such a method. For example, by using materials having different thermal contraction coefficients for the insulating substrate and the coverlay film, the warp during heating when these components are attached may be used. Moreover, like the technique disclosed in PTL 3 mentioned in Background Art, the wiring board unit may be molded to be curved in the lateral direction by adjusting the thickness of an adhesive. However, these methods may limit the thickness and the arrangement of materials. Moreover, since the intermediate product is curved in an initial stage of the manufacturing process, it may be difficult or may be impossible to use an apparatus having specifications for processing an intermediate product of an ordinary planar flexible printed wiring board. Therefore, it may be difficult to perform post-processing.

In the respective embodiments, a case in which the connection portion is integrated with adjacent wiring board units has been illustrated. However, the present disclosure may employ a configuration in which respective wiring board units are manufactured separately and the wiring board units are connected by a separate member.

REFERENCE SIGNS LIST

10 Insulating substrate
20 Wire
21, 22 Terminal portion
30 Coverlay film
40 Coverlay adhesive
50, 51, 52 Slit
61 First connection portion
62 Second connection portion
63 Third connection portion
64 Fourth connection portion
100, 100G, 100H Flexible printed wiring board
100A, 100GA, 100HA First wiring board unit
100B, 100GB, 100HB Second wiring board unit
100GC Third wiring board unit
100X, 100Y, 100GX, 100GY, 100HX Intermediate product
200 First member
300 Second member

The invention claimed is:

1. A flexible printed wiring board used in a state, in which one and another ends in a longitudinal direction are fixed respectively to one and another members that move in relation to each other, in a state of being bent to be curved in the longitudinal direction,
the flexible printed wiring board comprising:
a plurality of wiring board units in which a plurality of wires are formed on a flexible insulating substrate and which are molded in a state of being curved in a lateral direction, wherein
adjacent wiring board units are partially connected at side edges thereof in the lateral direction.

2. The flexible printed wiring board according to claim 1, wherein the adjacent wiring board units are connected in a region excluding a region in which a position, at which the wiring board unit is curved in the longitudinal direction, moves when the two members move in relation to each other.

3. The flexible printed wiring board according to claim 1, wherein the insulating substrate is formed of a thermoplastic resin and the respective wiring board units are molded to be curved in the lateral direction by a heating process.

4. The flexible printed wiring board according to claim 3, wherein the thermoplastic resin is a liquid crystal polymer.

5. A flexible printed wiring board used in a state, in which one and another ends in a longitudinal direction are fixed respectively to one and another members that move in relation to each other, in a state of being bent to be curved in the longitudinal direction,
the flexible printed wiring board comprising:
a plurality of wiring board units in which a plurality of wires are formed on a flexible insulating substrate and which are molded in a state of being curved in a lateral direction,
wherein adjacent wiring board units are partially connected at side edges thereof in the lateral direction,
wherein the curved portions in the lateral direction of the adjacent wiring board units protrude in different directions and connected portions of the adjacent wiring board units are bent, so that the plurality of wiring board units overlap each other.

6. A flexible printed wiring board used in a state, in which one and another ends in a longitudinal direction are fixed respectively to one and another members that move in relation to each other, in a state of being bent to be curved in the longitudinal direction,
the flexible printed wiring board comprising:
a plurality of wiring board units in which a plurality of wires are formed on a flexible insulating substrate and which are molded in a state of being curved in a lateral direction, wherein
adjacent wiring board units are partially integrally connected at side edges thereof in the lateral direction.

* * * * *